US012564075B2

(12) United States Patent
Simsek-Ege et al.

(10) Patent No.: US 12,564,075 B2
(45) Date of Patent: Feb. 24, 2026

(54) SEMICONDUCTOR DIE ASSEMBLIES WITH DECOMPOSABLE MATERIALS AND ASSOCIATED METHODS AND SYSTEMS

(71) Applicant: Micron Technology, Inc., Boise, ID (US)

(72) Inventors: Fatma Arzum Simsek-Ege, Boise, ID (US); Luoqi Li, Boise, ID (US); Marsela Pontoh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/922,192

(22) Filed: Oct. 21, 2024

(65) Prior Publication Data

US 2025/0046723 A1 Feb. 6, 2025

Related U.S. Application Data

(63) Continuation of application No. 18/507,908, filed on Nov. 13, 2023, now Pat. No. 12,125,796, which is a (Continued)

(51) Int. Cl.
*H01L 23/31* (2006.01)
*H01L 23/538* (2006.01)
*H01L 25/065* (2023.01)

(52) U.S. Cl.
CPC .......... *H01L 23/5385* (2013.01); *H01L 23/31* (2013.01); *H01L 23/5384* (2013.01); *H01L 23/5386* (2013.01); *H01L 25/0657* (2013.01)

(58) Field of Classification Search
CPC combination set(s) only.
See application file for complete search history.

(56) References Cited

U.S. PATENT DOCUMENTS 5,948,922 A 9/1999 Ober et al.
6,657,031 B1 12/2003 Crane et al.
(Continued)

FOREIGN PATENT DOCUMENTS

CN 103302910 A 9/2013

OTHER PUBLICATIONS

Anthony, S. 'The Future of Computers: 3D chip stacking', www.extremetech.com, 2012, 3 pgs.
Bailey, B. 'Target: 50% Reduction in Memory Power', Semiconductor Engineering, 2019, 5 pgs.
Feig, V. et al. 'Biodegradable Polymeric Materials in Degradable Electronic Devices', ACS Cent. Sci. 2018, No. 4, pp. 337-348.
(Continued)

*Primary Examiner* — Errol V Fernandes
(74) *Attorney, Agent, or Firm* — Dorsey & Whitney LLP

(57) ABSTRACT

Semiconductor die assemblies with decomposable materials, and associated methods and systems are disclosed. In an embodiment, a semiconductor die assembly includes a memory controller die carrying one or more memory dies attached to its first side. The semiconductor die assembly also includes a biodegradable structure attached to its second side opposite to the first side. The biodegradable structure includes a conductive material and an insulating material, both of which are biodegradable and disintegrate in a wet process. The biodegradable structure can be configured to couple the memory controller die with an interface die. In this manner, when the biodegradable structure disintegrates (e.g., dissolve) in the wet process, the memory controller carrying the memory dies can be separated from the interface die to reclaim the memory controller with the memory dies and the interface die.

20 Claims, 7 Drawing Sheets

Related U.S. Application Data continuation of application No. 17/463,994, filed on Sep. 1, 2021, now Pat. No. 11,817,393.

(56)                    References Cited

U.S. PATENT DOCUMENTS

| | | |
|---|---|---|
| 10,948,796 B2 | 3/2021 | Agrawal et al. |
| 2002/0089067 A1 | 7/2002 | Crane et al. |
| 2012/0211082 A1 | 8/2012 | Akiyama et al. |
| 2013/0140649 A1 | 6/2013 | Rogers et al. |
| 2016/0050750 A1 | 2/2016 | Rogers et al. |
| 2019/0348406 A1 | 11/2019 | Nakano et al. |
| 2020/0365557 A1 | 11/2020 | Tsai et al. |
| 2020/0388603 A1 | 12/2020 | Sankman et al. |
| 2023/0069261 A1 | 3/2023 | Simsek-Ege et al. |
| 2024/0079338 A1 | 3/2024 | Simsek-Ege et al. |

OTHER PUBLICATIONS

Feldman, M. 'Intel Goes Vertical, Will Stack Logic Chips Into 3D Packages', Top 500.org, 2018, 3 pgs.

Hosseini, E et al. 'Biodegradable Materials for Sustainable Health Monitoring Devices', ACS Appl. Bio. Mater. 2021, No. 4, pp. 163-194.

International Patent Application No. PCT/US2022/075604—International Search Report and Written Opinion mailed Dec. 22, 2022, 6 pages.

Lin, C. et al. 'PPT: Joint Performance/Power/Thermal Management of DRAM Memory for Multi-Core Systems', ISLPED, 2009, pp. 93-98.

Pal, S. et al. 'A Case for Packageless Processors', eScholarship.org, University of California, 2018, 16 pgs.

Wu, B. 'Embedded Ceramic Interconnect Bridge in Organic Substrate for Heterogeneous Integration and Multi-Chip Packaging', IEEE, Huawei Research, 2020, 3 pgs.

Zhu, Q. et al. 'A 3D-Stacked Logic-in-Memory Accelerator for Application-Specific Date Intensive Computing', Carnegie Mellon University Dept. of Electrical and Comp. Eng., 7 pgs.

102

SEMICONDUCTOR DIE ASSEMBLIES WITH DECOMPOSABLE MATERIALS AND ASSOCIATED METHODS AND SYSTEMS

CROSS-REFERENCE TO RELATED APPLICATION

This application is a continuation of U.S. application Ser. No. 18/507,908, filed Nov. 13, 2023, now U.S. Pat. No. 12,125,796, which is a continuation application of U.S. patent application Ser. No. 17/463,994, filed on Sep. 1, 2021, now U.S. Pat. No. 11,817,393, which are incorporated herein by reference in their entireties.

TECHNICAL FIELD

The present disclosure generally relates to semiconductor device assemblies, and more particularly relates to semiconductor device assemblies with decomposable materials and associated methods and systems.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. In other cases, edges of the semiconductor dies are aligned to each other to minimize the area occupied by the stack. In such cases, the semiconductor dies may be connected to each other using through-substrate vias (TSVs).

BRIEF DESCRIPTION OF THE DRAWINGS

Many aspects of the present technology can be better understood with reference to the following drawings. The components in the drawings are not necessarily to scale. Instead, emphasis is placed on clearly illustrating the overall features and the principles of the present technology.

DETAILED DESCRIPTION

Figure 1A:
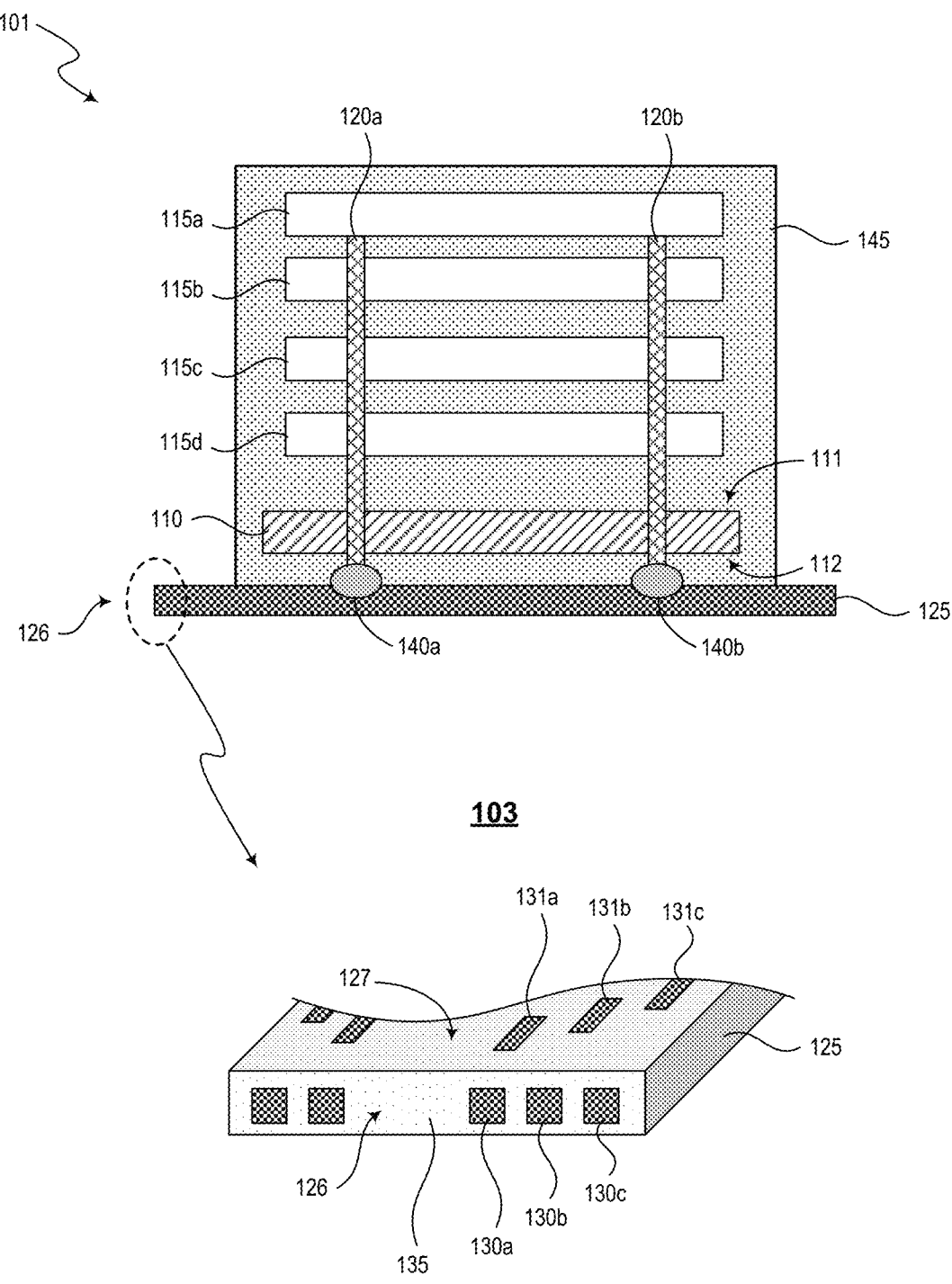
FIGS. 1A and 1B illustrate schematic diagrams of semiconductor die assemblies in accordance with embodiments of the present technology.

Specific details of several embodiments of semiconductor die assemblies with decomposable materials, and associated methods and systems are described below. The term "semiconductor device or die" generally refers to a solid-state device that includes one or more semiconductor materials. Examples of semiconductor devices (or dies) include logic devices or dies, memory devices or dies, interface devices or dies, controllers, memory controllers, or processors (e.g., central processing unit (CPU), graphics processing unit (GPU)), field-programmable gate arrays (FPGAs), among others.

Such semiconductor devices or dies may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a semiconductor substrate, a package substrate, an interposer, a semiconductor device or die, or the like. Suitable steps of the methods described herein can be performed with processing steps associated with fabricating semiconductor devices (wafer-level and/or die-level) and/or manufacturing semiconductor packages.

Modern electronic apparatuses or electronic devices (e.g., workstations, servers, desktop computers, laptop computers, tablets, cell phones, personal digital assistants) generally include a variety of packages of semiconductor dies. The semiconductor packages are difficult to recycle and tend to become electronic waste (e-waste) when the electronic apparatuses or devices are no longer in use or discarded. Conventional semiconductor packages include, in addition to various kinds of semiconductor dies, interconnects (e.g., solder materials, conductive pads, conductive pillars) connecting the semiconductor dies and molding compounds encapsulating the semiconductor dies. Such interconnects include materials like aluminum, copper, tin, lead, silver, bismuth, indium, zinc, antimony, among others. The molding compounds include epoxy resins, phenolic hardeners, silicas, catalysts, pigments, mold release agents, or the like.

The conventional molding compounds or interconnect materials are hard to remove to disassemble various components of the semiconductor packages (e.g., memory dies connected to memory controller dies, processor dies connected to the memory controller dies carrying memory dies). In some instances, removal of the molding compounds or interconnect materials generates hazardous (or toxic) by-products to humans or natural environments. Moreover, the molding compounds or interconnect materials are not easily biodegradable (or compostable) in nature once they become e-waste.

The present technology provides for utilizing decomposable materials for semiconductor die assemblies (e.g., packages of semiconductor dies, semiconductor packages) or for electronic systems including the semiconductor die assemblies. The decomposable materials are biodegradable (or compostable) to reduce electronic waste when the semiconductor die assemblies (or the systems including semiconductor die assemblies) are discarded. Further, the decomposable materials are relatively easy to remove (e.g., easily disintegrate than the molding compounds or the interconnect materials described above) such that components of the semiconductor die assemblies can be disassembled without difficulties. For instance, when subject to certain wet chemical process steps, the decomposable materials can dissolve (e.g., disintegrate, break up, separate) in the wet process. Further, during the wet process, the decomposable materials may turn into non-toxic substances such that the disassembly processes do not generate toxic (or hazardous) byproducts to humans or to the natural environments.

The reclaimed components (or reclaimed semiconductor die assemblies) may be recycled in a variety of electronic systems. For example, the reclaimed components or semiconductor die assemblies include memory components including one or more memory dies connected to a memory controller die (or a logic die). In this regard, such memory components may be examples of or include aspects of high-bandwidth memory (HBM), hybrid memory cube (HMC), semiconductor modules for the compute express link (CXL) applications, or systems in package (SIPs).

In some embodiments, the reclaimed memory components may be re-purposed in a system that implements a memory hierarchy different than a traditional memory hierarchy based on performance criteria of the memory components, such as access time. Namely, the memory hierarchy may be based on lifetimes (or reliability criteria) of the reclaimed memory components (rather than their performance criteria). For example, the memory component with the shortest lifetime (or worst reliability parameters) in the system may define the reuse process—e.g., determining whether the system needs to be disassembled to reclaim other components in the system.

In some embodiments, the systems utilizing reclaimed memory components (or reclaimed semiconductor die assemblies) have relatively relaxed specifications (or requirements for the reclaimed memory components to satisfy)—e.g., a less storage capacity than the original storage capacity, increased access time or latency, increased power consumption, operating under slower clock speeds, or the like. In some embodiments, the systems including reclaimed memory components are designed for less demanding applications such as toys, robots for hobbies, non-critical sensors or timers, to name a few. In other words, the reclaimed memory components may not be deployed in mission-critical applications such as data centers, autonomous driving systems, medical equipment, or the like.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1A illustrates a schematic diagram of a semiconductor die assembly 101 in accordance with embodiments of the present technology. The semiconductor die assembly 101 includes a first semiconductor die 110 that has a first side 111 and a second side 112 opposite to the first side 111. The semiconductor die assembly 101 also includes one or more second semiconductor dies 115 (also identified individually as semiconductor dies 115a through 115d) attached to the first side 111. The second semiconductor dies 115 are operatively coupled to the first semiconductor die 110—e.g., using through-substrate vias (TSVs) 120 (also identified individually as TSVs 120a and 120b). In some embodiments, the first semiconductor die 110 is a memory controller die (or a logic die) and the second semiconductor dies 115 are DRAM dies (or NOT-AND (NAND) memory dies). Further, the DRAM die coupled to the first semiconductor die 110 (e.g., the second semiconductor die 115d) may be referred to as a master DRAM die while the other DRAM dies (e.g., the second semiconductor dies 115a-c) may be referred to as slave DRAM dies. As shown in FIG. 1A, the topmost second semiconductor die (e.g., the second semiconductor die 115a) does not include TSVs 120. In some embodiments, the topmost second semiconductor die (e.g., the second semiconductor die 115a) may be thicker than the other second semiconductor dies (e.g., the second semiconductor dies 115b-d).

Moreover, in the embodiment illustrated in FIG. 1A, the semiconductor die assembly 101 includes a biodegradable structure 125 attached to the second side 112 of the first semiconductor die 110. The biodegradable structure 125 may be configured to easily disintegrate (e.g., dissolve, break up, separate) when subject to certain wet chemical process steps (e.g., in a wet process). In this regard, the biodegradable structure 125 includes a conductive material and an insulating material, both of which are biodegradable and disintegrate in the wet process. Further, the biodegradable structure 125 can turn into non-toxic substances in the wet process. In some embodiments, the biodegradable conductive materials includes melanin, polyacetylene, polystyrene sulfonate (PEDOT), polyaniline (PANI), polycationic polymer (PPy), 3-hexylthiophene (P3HT), or a combination thereof. In some embodiments, the biodegradable insulating material includes polylactic acid (PLA) with cellulose acetate (CA), zinc pyrophosphate (ZnPP), polyurethane (PU) with CA, or a combination thereof.

The conductive material in the biodegradable structure 125 can be arranged to form conductive traces such that the first semiconductor die 110 can be connected to the conductive traces of the biodegradable structure 125. In some embodiments, the TSVs 120 can be connected to the conductive traces of the biodegradable structure 125 through interconnects 140 (also identified individually as interconnects 140a/b). In some embodiments, the interconnects 140 includes the biodegradable conductive materials. In this manner, the conductive traces of the biodegradable structure 125 provide for the first semiconductor die 110 (and for the second semiconductor dies 115) electrical connections to another semiconductor die (e.g., a third semiconductor die, an interface die 220 depicted in FIG. 2). In some embodiments, such electrical connections are done at a sidewall 126 of the biodegradable structure 125. In this regard, the sidewall 126 of the biodegradable structure 125 includes one or more portions of the conductive traces exposed to connect with corresponding bond pads of the third semiconductor die.

FIG. 1A also includes a diagram 103 illustrating an embodiment of the biodegradable structure 125 configured to couple the first semiconductor die 110 to a third semiconductor die at its sidewall 126. The conductive traces of the biodegradable structure 125 has first exposed portions 130 (also identified individually as 130a-c) at the sidewall

126. Each of the first exposed portions 130 (exposed from the biodegradable insulating material 135) can be configured to connect to a corresponding bond pad of the third semiconductor die. Additionally, the conductive traces of the biodegradable structure 125 has second exposed portions 131 (also identified individually as 131*a-c*) at a surface 127 of the biodegradable structure 125. Each of the second exposed portions 131 can be configured to connect to a corresponding TSVs 120—i.e., the conductive material of the biodegradable structure 125 is operatively coupled to the first semiconductor die 110. In this manner, each of the conductive traces of the biodegradable structure 125 can couple the TSVs connected to the first semiconductor die 110 with corresponding bond pads of the third semiconductor die.

The semiconductor die assembly 101 may further include an encapsulating structure 145. In some embodiments, the encapsulating structure 145 includes the same biodegradable insulating material as the biodegradable structure 125. In other embodiments, the encapsulating structure 145 includes a biodegradable insulating material different than the biodegradable insulating material of the biodegradable structure 125. For example, the insulating material of the encapsulating structure 145 has a slower removal rate in the wet process than the biodegradable insulating material of the biodegradable structure 125. In this manner, when the insulating material of the biodegradable structure 125 has disintegrated (e.g., dissolved) in the wet process, the insulating material of the encapsulating structure 145 still remains to protect the first semiconductor die 110 and the second semiconductor dies 115. In yet another embodiments, the encapsulating structure 145 includes a conventional molding material described above. In a particular aspect of an embodiment shown in FIG. 1A, the encapsulating structure 145 encloses the first semiconductor die 110. As such, the first semiconductor die 110 communicates with a third semiconductor die (e.g., the interface die 220) through the biodegradable structure 125.

Figure 1B:
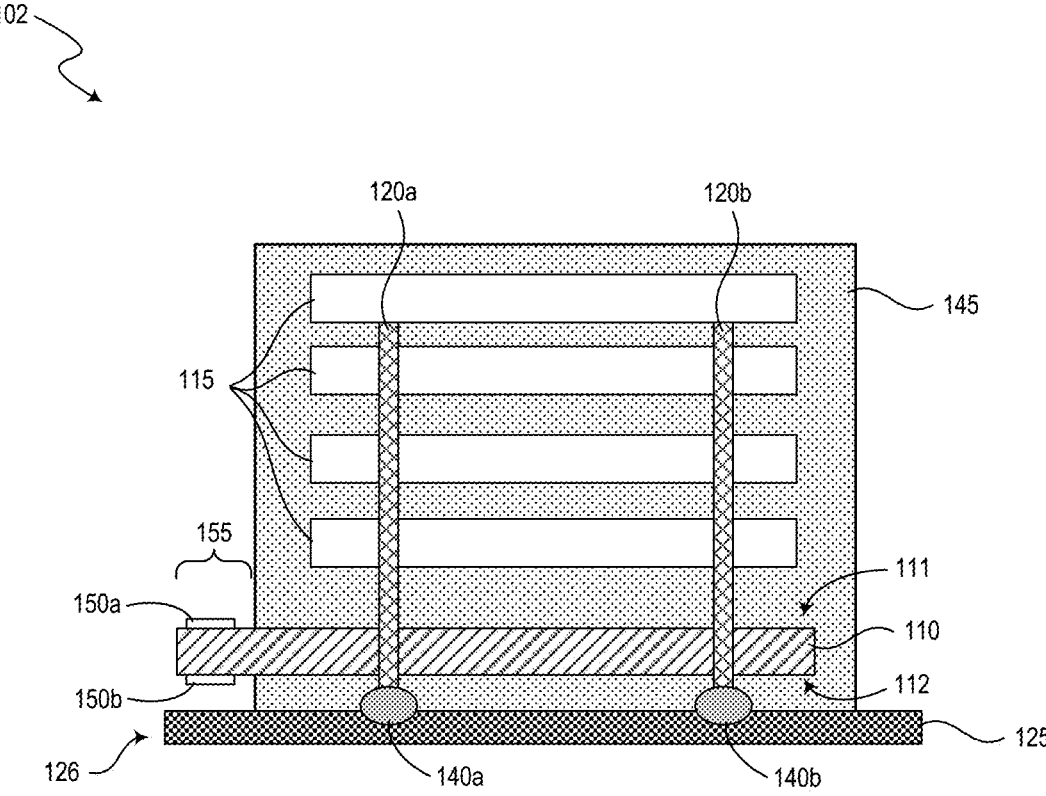

FIG. 1B illustrates a schematic diagram of a semiconductor die assembly 102 in accordance with embodiments of the present technology. The semiconductor die assembly 102 includes aspects of the semiconductor die assembly 101 described above. For example, the semiconductor die assembly 102 includes the first semiconductor die 110 carrying the stack of second semiconductor dies 115. Further, the semiconductor die assembly 102 includes the biodegradable structure 125.

In a particular aspect of an embodiment shown in FIG. 1B, the encapsulating structure 145 partially encloses the first semiconductor die 110. In other words, the first semiconductor die 110 includes a porch 155 extending out of the encapsulating structure 145. Moreover, the porch has one or more bond pads 150 (also identified individually as bond pads 150*a/b*) configured to couple to corresponding bond pads of a third semiconductor die (e.g., the interface die 220). In this manner, the first semiconductor die 110 can directly communicate with the third semiconductor die. In some embodiments, the direct communication paths between the first semiconductor die 110 and the third semiconductor die 220 facilitate faster signal transmission between the two semiconductor dies—e.g., when compared to the communication paths through the biodegradable structure 125.

Figure 2:
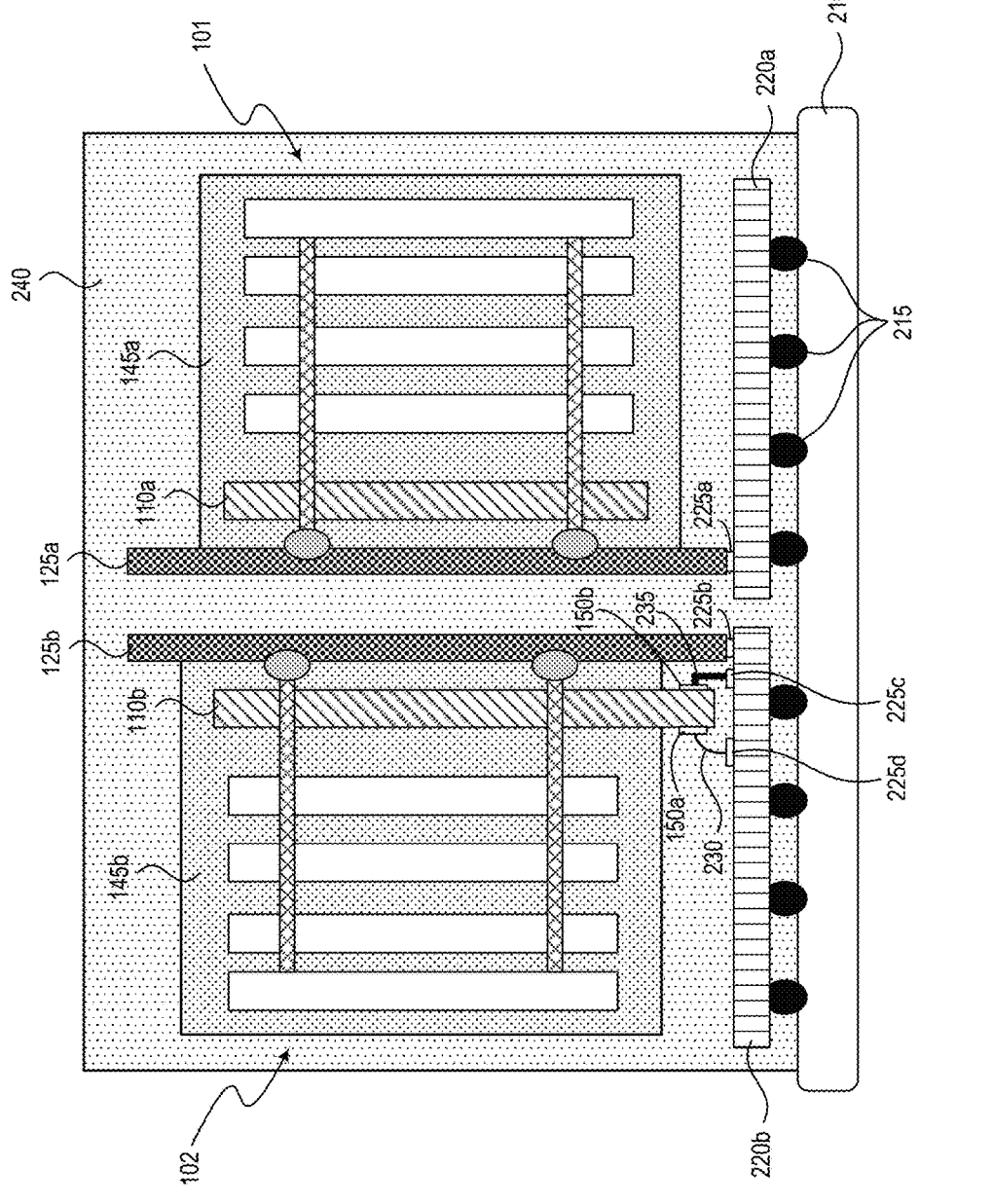
FIG. 2 illustrates a schematic diagram of a system including semiconductor die assemblies in accordance with embodiments of the present technology.

FIG. 2 illustrates a schematic diagram of a system 200 including semiconductor die assemblies 101 and 102 in accordance with embodiments of the present technology. The system 200 includes a printed circuit board (PCB) 210, interface dies 220 (also identified individually as interface dies 220*a/b*) attached to the PCB 210. Each of the interface dies 220 has a surface opposite to the PCB 210, to which the semiconductor die assembly (e.g., the semiconductor die assembly 101 or 102) is attached. In some embodiments, the interface dies 220 include processors (e.g., arithmetic logic units (ALUs), GPUs) or other suitable semiconductor dies serving the purpose of the system 200. In some embodiments, the interface die 220 is configured to control analog input/output (I/O) signals (e.g., control signals, power signals) and the first semiconductor die 110 is configured to control logic I/O signals for the system 200. In some embodiments, the semiconductor die assembly 101 or 102 includes aspects of HBM, HMC, modules for CXL applications, or SIPs. In some embodiments, the interface die 220 includes aspects of GPUs or CPUs.

The interface dies 220 can be attached to the PCB 210 using interconnects 215. In some embodiments, the interconnects 215 include ball grid array (BGA) with conventional interconnect materials. In other embodiments, the interconnects 215 include one or more of the biodegradable conductive materials. Moreover, the system 200 includes an encapsulating structure 240 on the PCB 210, which is configured to enclose the interface dies 220 and the semiconductor die assemblies 101/102. In some embodiments, the encapsulating structure 240 includes one or more of the biodegradable insulating materials.

As described with reference to the diagram 103 of FIG. 1A, the biodegradable structures 125 of the semiconductor die assemblies 101/102 are configured to attached to bond pads 225 (e.g., the bond pads 225*a* and 225*b*) of the interface dies 220, respectively. For example, the biodegradable structure 125*a* is attached to the bond pad 225*a* of the interface die 220*a* at its sidewall facing the interface die 220*a*. In this regard, the exposed portion 130 at the sidewall 126 of the biodegradable structure 125*a* are bonded to (attached to) the bond pad 225*a* of the interface die 220*a*—i.e., the conductive material of the biodegradable structure 125*a* is operatively coupled to the interface die 220*a*. Although the cross-sectional illustration of the semiconductor die assembly 200 shows a single bond pad 225*a* of the interface die 220*a*, it should be understood that the interface die 220*a* may include multiple bond pads, each of them coupled to a corresponding exposed portion 130 of the conductive traces of the biodegradable structure 125*a*.

In some embodiments, the exposed portion 130 directly attaches to the bond pad 225*a* in response to thermal energy applied to the exposed portion 130 and the bond pad 225*a* in close proximity—e.g., a direct bonding scheme. In other embodiments, a soldering material (not shown) or a biodegradable conductive material is used to facilitate bonding between the exposed portion 130 and the bond pad 225*a*. In this manner, the first semiconductor die 110 (and the second semiconductor dies 115 operatively coupled to the first semiconductor die 110) can communicate with the interface die 220 through the biodegradable structure 125—e.g., communication paths (or channels) or data paths (or channels) configured to transmit and receive signals and/or data between the interface die 220 and the first semiconductor die 110 (and the second semiconductor dies 115 operatively coupled to the first semiconductor die 110). Further, as illustrated in FIG. 2, the first and second semiconductor dies 110 and 115 are arranged generally perpendicular to the interface die 220.

Similarly, the semiconductor die assembly 102 is attached to the interface die 220*b* through the biodegradable structure 125*b*. Namely, the biodegradable structure 125*b* is attached to the bond pad 225b of the interface die 220b at its sidewall facing the interface die 220b as described above with respect to the biodegradable structure 125a attached to the bond pad 225a of the interface die 220a. Further, the semiconductor die assembly 102 includes the first semiconductor die 110b with the porch 155 out of the incapsulating structure 145b. The porch includes bond pads 150a/b of the first semiconductor die 110b. In some embodiments, a bond wire 230 couples the bond pad 150a of the first semiconductor die 110b to the bond pad 225d of the interface die 220b. Additionally, or alternatively, a conductive pillar structure 235 may couple the bond pad 150b of the first semiconductor die 110b to the bond pad 225c of the interface die 220b.

In this manner, the first semiconductor die 110b can communicate directly with the interface die 220b in addition to the communication paths established through the biodegradable structure 125b. Such direct communication paths may facilitate high-speed signal or data transmission between the interface die 220b and the first semiconductor die 110b (and the second semiconductor dies 115 operatively coupled to the first semiconductor die 110b)—e.g., high-speed data paths (or channels), high-speed signal paths (or channels).

In view of the semiconductor die assembly 101 (or 102) stacked on top of the interface die 220, the system 200 has a footprint that is less than that of a system having the semiconductor die assembly and the interface die 220 disposed side-by-side. In some embodiments, the interface die 220 corresponds to a GPU and the semiconductor die assembly 101 (or 102) corresponds to an HBM including an HBM controller (e.g., the first semiconductor die 110) carrying one or more DRAM dies (e.g., the second semiconductor dies 115). The GPU may communicate with the HBM controller through the biodegradable structure 125 to access (e.g., read or write data) the DRAM dies. If the system 200 supports high-speed data transfer rates to access the DRAM dies, the GPU may directly communicate with the HBM controller through the high-speed data paths established between them—e.g., the bond pads of the GPU directly connected to the bond pads of the HBM controller.

Moreover, the semiconductor die assembly 101 (or 102) can be easily disassembled from the system 200 because the semiconductor die assembly 101 (or 102) is attached to the interface die 220 through the biodegradable structure 125. For example, the encapsulating structure 240 including the biodegradable insulating materials can be removed in a wet process. Subsequently, the biodegradable structure 125 disintegrates in the wet process, thereby releasing the semiconductor die assembly 101 (or 102) from the interface die 220. Further, if the interconnects 215 are made of the biodegradable conductive materials, the interface die 220 can be released from the PCB 210 in the wet process. In this manner, the biodegradable materials can facilitate separating components of the system 200 such that the reclaimed components (e.g., the semiconductor die assembly 101/102, the interface dies 220a/b) can be recycled instead of becoming e-waste. Even if the system 200 is discarded, the biodegradable materials of the system 200 (e.g., the biodegradable contents of the system 200) are expected to reduce the total amount of e-waste.

Although the system 200 of FIG. 2 includes two semiconductor die assemblies 101 and 102 for illustration purposes only (e.g., to describe two different ways of establishing communication paths between the first semiconductor die 110 and the interface die 220), the present technology is not limited thereto. For example, the system may include one semiconductor die assembly (the semiconductor die assembly 101 or the semiconductor die assembly 102) attached to a single interface die 220. In another example, the system may include three (3), four (4), or greater quantities of semiconductor die assemblies (and corresponding interface dies). In some embodiments, all the semiconductor die assemblies of the system include same kinds of second semiconductor dies 115—e.g., memory dies (e.g., DRAM dies, NAND memory dies). In other embodiments, the semiconductor die assemblies of the system may include different kinds of memory dies as the second semiconductor dies 115 (e.g., one or more including DRAM dies, others including NAND memory dies).

Figure 3A:
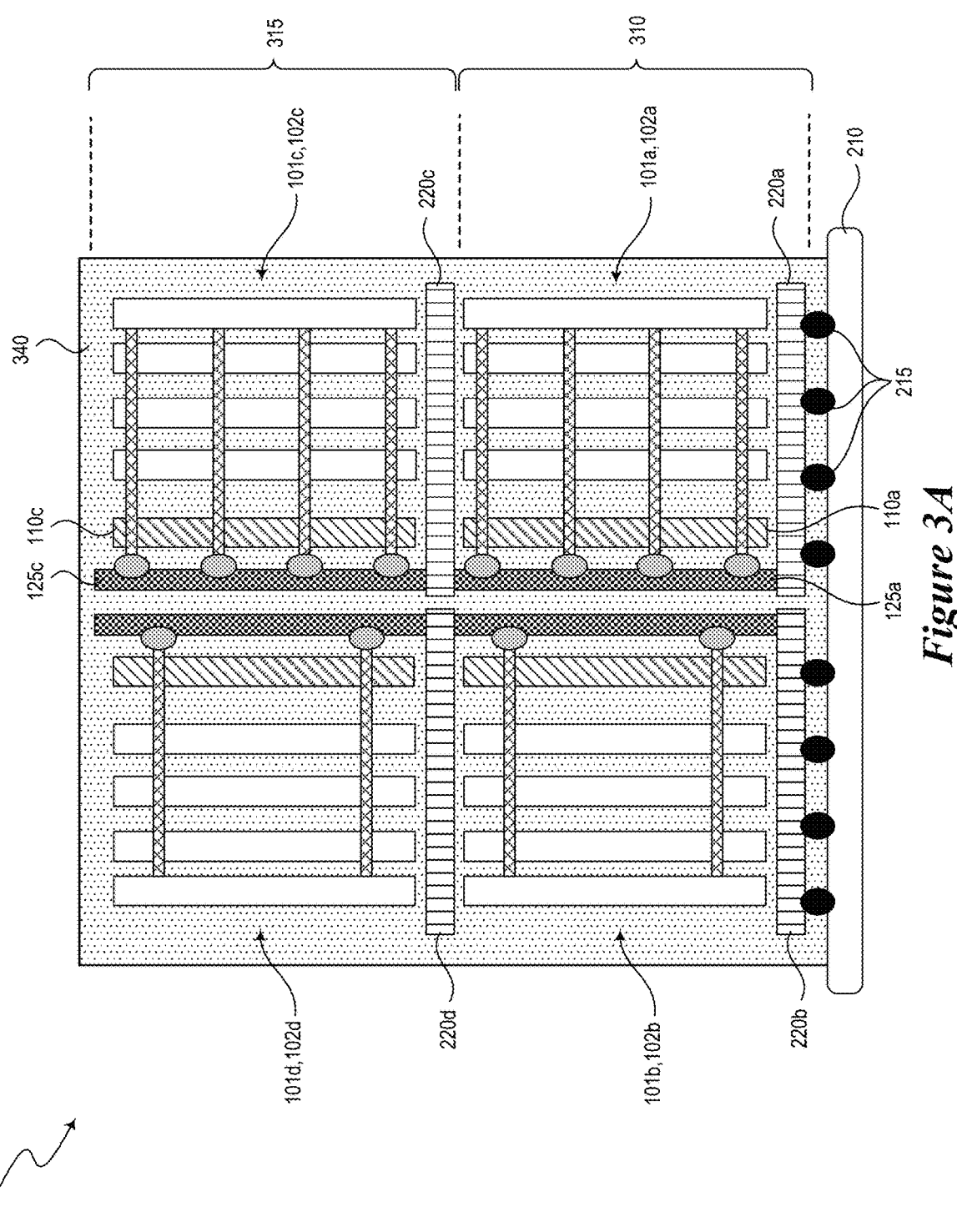
FIGS. 3A-3C illustrate schematic diagrams of systems including semiconductor die assemblies in accordance with embodiments of the present technology.

FIG. 3A illustrates a schematic diagram of a system 301 including semiconductor die assemblies 101 and/or 102 in accordance with embodiments of the present technology. The system 301 includes aspects of the system 200 described with reference to FIG. 2. For example, the system 301 includes semiconductor die assemblies 101a/b and/or 102a/b attached to the interface dies 220a/b. Details of the connection schemes between the semiconductor die assembly 101/102 and the interface die 220 described with reference to FIG. 2 (e.g., the biodegradable structure 125 attached to the bond pad 225 of the interface die 220 at its sidewall facing the interface die 220, the bond pads 150 of the first semiconductor die 110 directly coupled to the bond pads 225 of the interface die 220) are omitted in the diagram of the system 301 for a clear illustration of overall features and principles of the present technology. Also, the encapsulating structures 145 of the semiconductor die assemblies 101/102 are omitted.

The system 301 includes a first deck 310 (a lower deck, a bottom deck) having two semiconductor die assemblies (e.g., the semiconductor die assemblies 101a/b and/or 102a/b) and a second deck 315 (an upper deck, a top deck) having two semiconductor die assemblies (e.g., the semiconductor die assemblies 101c/d and/or 102c/d). The system 301 includes an encapsulating structure 340 on the PCB 210, which is configured to enclose the interface dies 220 and the semiconductor die assemblies 101/102 of both decks. In some embodiments, the encapsulating structure 340 includes the biodegradable insulating materials.

In some embodiments, the interface die of the upper deck (e.g., the interface die 220c) relays signals from the semiconductor die assembly of the upper deck (e.g., semiconductor die assembly 101c/102c) to the interface die of the lower deck (e.g., the interface die 220a) through the biodegradable structure 125a. As such, the biodegradable structure 125a may be configured to communicate signals with the interface die 220c at its top sidewall attached to the interface die 220c (opposite to its bottom sidewall attached to the interface die 220a). Further, the interface die 220c may be configured to include bond pads at its both surfaces (e.g., top and bottom surfaces) such that the biodegradable structure 125c can be attached to the bond pads facing the biodegradable structure 125c (at its top surface) and the biodegradable structure 125a can be attached to the bond pads facing the biodegradable structure 125a (at its bottom surface).

Figure 3B:
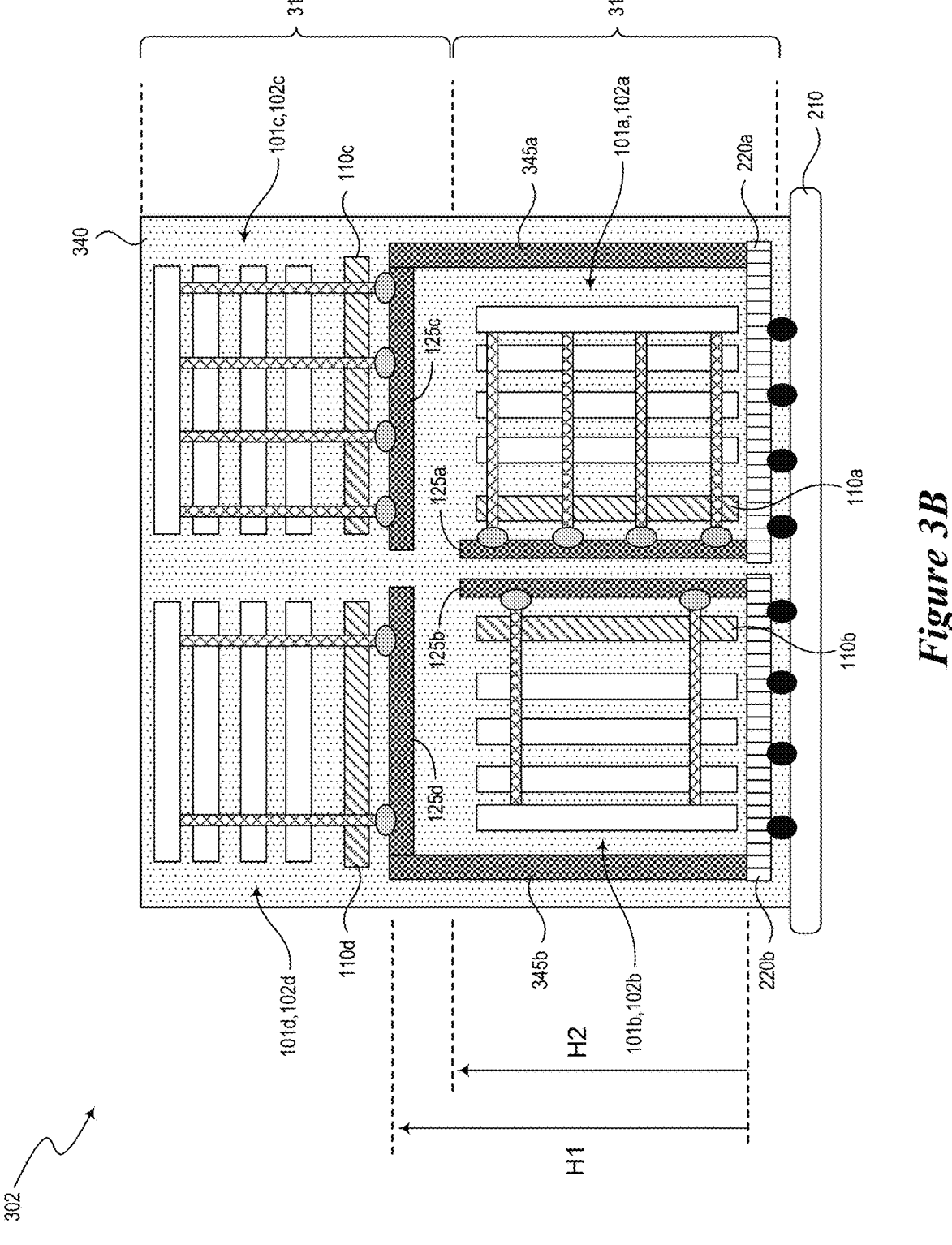

FIG. 3B illustrates a schematic diagram of a system 302 including semiconductor die assemblies 101 and/or 102 in accordance with embodiments of the present technology. As with the system 301, the system 302 includes aspects of the system 200 described with reference to FIG. 2—e.g., semiconductor die assemblies 101a/b and/or 102a/b attached to the interface dies 220a/b. Further, the system 302 includes the first and second decks 310 and 315. As such, the system 302 may be regarded as a variation of the system 301 with certain differences.

For example, the system 302 does not include interface dies for the semiconductor die assemblies of the upper deck 315 (i.e., the interface dies 220c/d of the system 301 are omitted). Instead, the interface dies of the lower deck 310 (e.g., the interface dies 220a/b) access the semiconductor die assemblies 101c/d and/or 102c/d through vertical biodegradable structures 345 (also identified individually as vertical biodegradable structures 345a/b) attached to the interface dies 220a/b of the lower deck 310. The vertical biodegradable structures 345 extend from the surface of the interface dies 220a/b to a height (denoted as H2) greater than the height (denoted as H1) of the semiconductor die assemblies 101a/b and/or 102a/b of the lower deck 310. Further, the vertical biodegradable structures 345 can be configured similarly to the biodegradable structures 125. Namely, the vertical biodegradable structures 345 may be configured to easily disintegrate in a wet process. Moreover, the vertical biodegradable structures 345 include the conductive material and the insulating material, both of which are biodegradable and disintegrate in the wet process.

The conductive material in the vertical biodegradable structures 345 can be arranged to form conductive traces such that the conductive traces of the biodegradable structures of the upper deck semiconductor die assemblies can be connected to the conductive traces of the vertical biodegradable structure 345 appropriately. For example, the conductive traces of the biodegradable structure 125c of the semiconductor die assemblies 101c/102c can be connected to the conductive traces of the vertical biodegradable structure 345a appropriately, and the conductive traces of the vertical biodegradable structure 345a are connected to the bond pads of the interface die 220a. In this manner, the vertical biodegradable structures 345 can provide signal paths (e.g., communication paths, data paths) between the first semiconductor dies 110c/d (and the second semiconductor dies 115 operatively coupled to the first semiconductor dies 110c/d) of the upper deck 315 and the interface dies 220a/b of the lower deck 310.

Figure 3C:
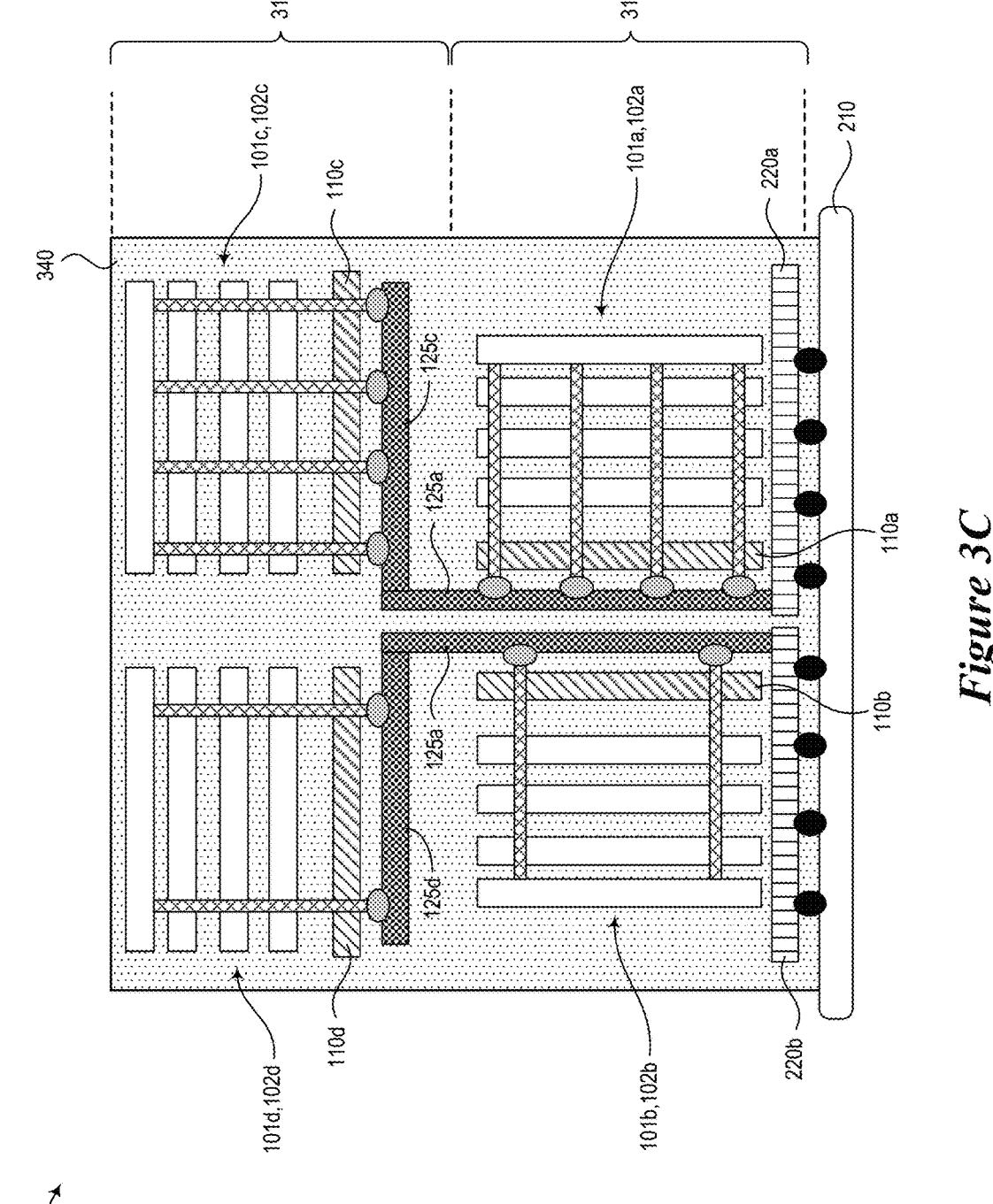

FIG. 3C illustrates a schematic diagram of a system 303 including semiconductor die assemblies 101 and/or 102 in accordance with embodiments of the present technology. As with the systems 301 and 302, the system 303 includes aspects of the system 200 described with reference to FIG. 2—e.g., semiconductor die assemblies 101a/b and/or 102a/b attached to the interface dies 220a/b. Further, the system 303 includes the first and second decks 310 and 315. As such, the system 303 may be regarded as another variation of the systems 301 and 302 with certain differences.

For example, as with the system 302, the system 303 does not include interface dies for the semiconductor die assemblies of the upper deck 315. Further, the system 303 does not include the vertical biodegradable structures 345 of the system 302. Instead, the biodegradable structures 125 of the lower deck semiconductor die assemblies 101a/b (or 102a/b) extend to the upper deck 315 such that the conductive traces of the biodegradable structures 125 of the lower deck semiconductor die assemblies 101a/b (or 102a/b) can be connected to the conductive traces of the biodegradable structures 125 of the upper deck semiconductor die assemblies 101c/d (or 102c/d) appropriately. By way of example, the conductive traces of the biodegradable structure 125a can be connected to the conductive traces of the biodegradable structure 125c. In this manner, the combination of the biodegradable structures 125 (e.g., the combination of the biodegradable structures 125a and 125c) can provide signal paths (e.g., communication paths, data paths) between the first semiconductor dies 110c/d (and the second semiconductor dies 115 operatively coupled to the first semiconductor dies 110c/d) of the upper deck 315 and the interface dies 220a/b of the lower deck 310.

Although forgoing example embodiments of the systems 301 through 303 includes two decks of semiconductor die assemblies for illustration purposes, the present technology is not limited thereto. For example, the systems in accordance with the present technology may include three (3), four (4), five (5), or even greater quantities of decks. Moreover, although the example embodiments of the systems 301 through 303 includes two semiconductor die assemblies per deck for illustration purposes, in other embodiments, each deck may include one (1) semiconductor die assembly or more than two semiconductor die assemblies—e.g., three (3), four (4), or even greater quantities of semiconductor die assemblies.

Figure 4:
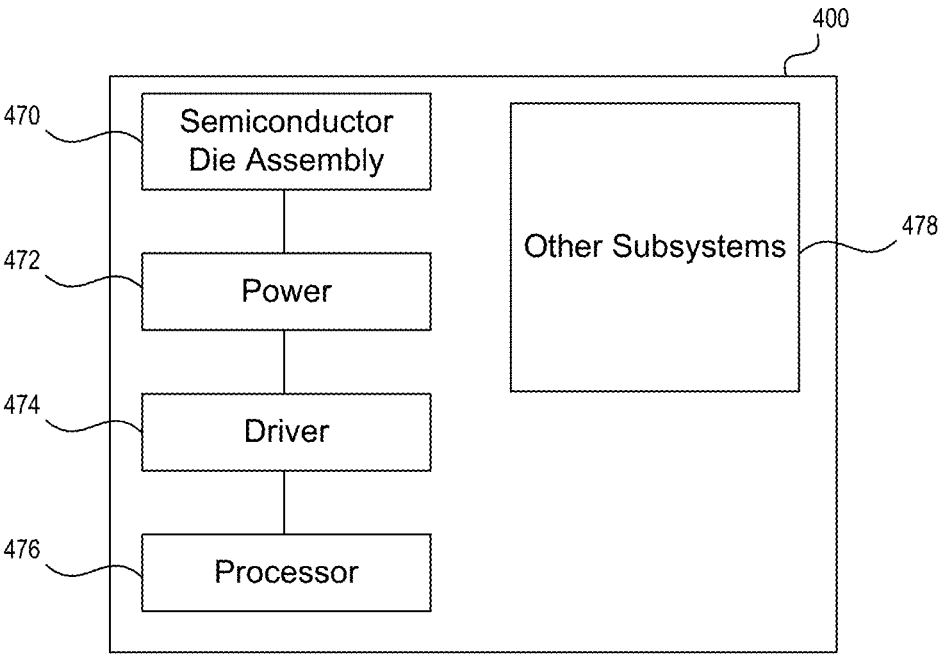
FIG. 4 is a block diagram schematically illustrating a system including a semiconductor die assembly in accordance with embodiments of the present technology.

FIG. 4 is a block diagram schematically illustrating a system 400 including a semiconductor die assembly in accordance with embodiments of the present technology. The system 400 may be an example of or include aspects of the systems 200, 301, 302, or 303 described with reference to FIGS. 2, and 3A-3C. The system 400 can include a semiconductor device assembly 470, a power source 472, a driver 474, a processor 476, and/or other subsystems or components 478. The semiconductor die assembly 101 or 102 described with reference to FIGS. 1A and 1B may be included in the semiconductor device assembly 470 of the system 400.

The semiconductor device assembly 470 can have features generally similar to the semiconductor die assembly 101 or 102 described above with reference to FIGS. 1A and 1B. For example, the semiconductor device assembly 470 includes a first semiconductor die including a first side and a second side opposite to the first side, one or more second semiconductor dies attached to the first side, the one or more second semiconductor dies operatively coupled to the first semiconductor die, and a biodegradable structure attached to the second side, the biodegradable structure configured to disintegrate in a wet process, where the biodegradable structure includes a conductive material and an insulating material, both of which are biodegradable and disintegrate in the wet process.

The system 400 can have features generally similar to the system 200, 301-303 described above with reference to FIGS. 2 and 3A-3C. For example, the system 400 includes a printed circuit board (PCB) and an interface die attached to the PCB, the interface die having a surface opposite to the PCB. The system 400 further includes a semiconductor die assembly attached to the surface, where the semiconductor die assembly includes a memory controller die having a first side and a second side opposite to the first side, one or more memory dies attached to the first side, the one or more memory dies operatively coupled to the memory controller die, and a biodegradable structure attached to the second side, the biodegradable structure configured to disintegrate in a wet process, where the biodegradable structure includes a conductive material and an insulating material, both of which are biodegradable and disintegrate in the wet process.

The resulting system 400 can perform any of a wide variety of functions, such as memory storage, data processing, and/or other suitable functions. Accordingly, representative systems 400 can include, without limitation, handheld devices (e.g., mobile phones, tablets, digital readers, and digital audio players), computers, and appliances. Components of the system 400 may be housed in a single unit or distributed over multiple, interconnected units (e.g., through a communications network). The components of the system 400 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of forming a semiconductor die assembly, comprising:
   providing a first semiconductor die including a first side and a second side opposite to the first side;
   attaching a biodegradable structure including conductive material and an insulating material to the second side of the first semiconductor die, wherein both the conductive material and the insulating material are biodegradable and configured to disintegrate in a wet process; and
   operatively coupling the conductive material of the biodegradable structure to the first semiconductor die.

2. The method of claim 1, wherein the conductive material forms conductive traces arranged to operatively couple the first semiconductor die to a second semiconductor die at a sidewall of the biodegradable structure.

3. The method of claim 2, wherein the sidewall includes one or more portions of the conductive traces exposed to connect with corresponding bond pads of the second semiconductor die.

4. The method of claim 2, further comprising, with the wet process, separating the first semiconductor die from the second semiconductor die.

5. The method of claim 1, wherein the wet process converts the biodegradable structure into a non-toxic substance.

6. The method of claim 1, wherein:
   the conductive material includes melanin, polyacetylene, polystyrene sulfonate (PEDOT), polyaniline (PANI), polycationic polymer (PPy), 3-hexylthiophene (P3HT), or a combination thereof; and
   the insulating material includes polylactic acid (PLA) with cellulose acetate (CA), zinc pyrophosphate (ZnPP), polyurethane (PU) with CA, or a combination thereof.

7. The method of claim 1, further comprising:
   forming an encapsulating structure on the biodegradable structure to enclose at least a portion of the first semiconductor die, and wherein the encapsulating structure includes the biodegradable insulating material.

8. The method of claim 7, wherein the first semiconductor die includes a porch extending out of the encapsulating structure, the porch having one or more bond pads configured to couple to corresponding bond pads of a second semiconductor die.

9. The method of claim 1, wherein:
   the first semiconductor die comprises a memory controller die or a memory die.

10. A method of forming a system, comprising:
    providing a printed circuit board (PCB);
    attaching an interface die to the PCB, the interface die having a surface opposite to the PCB; and
    attaching a semiconductor die assembly to the surface, wherein the semiconductor die assembly includes:
       a first die having a first side and a second side opposite to the first side; and
       a biodegradable structure attached to the second side, the biodegradable structure including a conductive material operatively coupled to the first die and an insulating material, wherein both the conductive material and the insulating material are biodegradable and configured to disintegrate in a wet process.

11. The method of claim 10, further comprising forming conductive traces from the conductive material to operatively couple the first die to the interface die at a sidewall of the biodegradable structure.

12. The method of claim 11, wherein the sidewall of the biodegradable structure includes one or more portions of the conductive traces exposed, and further comprising connecting exposed portions of the conductive traces to corresponding bond pads of the interface die.

13. The method of claim 10, wherein the first and second sides of the first die are perpendicular to the surface of the interface die.

14. The method of claim 10, wherein the semiconductor die assembly includes an encapsulating structure enclosing at least a portion of the first die, and wherein the encapsulating structure includes the insulating material.

15. The method of claim 14, wherein the first die includes a porch extending out of the encapsulating structure, the porch having one or more bond pads coupled to corresponding bond pads of the interface die.

16. The method of claim 10, further comprising:
  forming an encapsulating structure on the PCB to enclose the interface die and the semiconductor die assembly, wherein the encapsulating structure includes the biodegradable insulating material.

17. The method of claim 10, further comprising:
performing a wet etch process to disintegrate the conductive material and the insulating material.

18. A method of recycling a semiconductor device assembly, comprising:
  providing the semiconductor device assembly including:
    a first semiconductor die including a first side and a second side opposite to the first side; and
    a biodegradable structure attached to the second side, the biodegradable structure including a conductive material operatively coupled to the first semiconductor die and an insulating material; and
  performing a wet process to disintegrate both the conductive material and the insulating material.

19. The method of claim 18 wherein the wet process converts the biodegradable structure into a non-toxic substance.

20. The method of claim 18 wherein the wet process further separates the first semiconductor die from a second semiconductor die coupled therewith by the conductive material.

\* \* \* \* \*